US010698059B2

(12) United States Patent
Campagna

(10) Patent No.: US 10,698,059 B2
(45) Date of Patent: Jun. 30, 2020

(54) MR SYSTEM AND METHOD FOR TRANSMITTING CONTROL DATA TO A DIGITAL CONTROL DEVICE IN AN MR SYSTEM

(71) Applicant: Siemens Healthcare GmbH, Erlangen (DE)

(72) Inventor: Swen Campagna, Engelthal (DE)

(73) Assignee: SIEMENS HEALTHCARE GMBH, Erlangen (DE)

( * ) Notice: Subject to any disclaimer, the term of this patent is extended or adjusted under 35 U.S.C. 154(b) by 0 days.

(21) Appl. No.: 16/170,168

(22) Filed: Oct. 25, 2018

(65) Prior Publication Data

US 2019/0137587 A1 May 9, 2019

(30) Foreign Application Priority Data

Nov. 6, 2017 (EP) .................................... 17200151

(51) Int. Cl.
*G01R 33/36* (2006.01)
*G01R 33/54* (2006.01)
(Continued)

(52) U.S. Cl.
CPC .......... *G01R 33/546* (2013.01); *G01R 33/36* (2013.01); *G01R 33/543* (2013.01);
(Continued)

(58) Field of Classification Search
CPC ............. G01R 33/543; G01R 33/5608; G01R 33/4828; G01R 33/546; G01R 33/56509; G01R 33/4633; G01R 33/482; G01R 33/5611; G01R 33/3415; G01R 33/283; G01R 33/307; G01R 33/60; G06T 1/20;
(Continued)

(56) References Cited

U.S. PATENT DOCUMENTS 5,109,854 A * 5/1992 Provost ............ G01R 33/56545 324/309
5,349,296 A * 9/1994 Cikotte .................. G01R 33/54 324/309

(Continued)

FOREIGN PATENT DOCUMENTS

DE 102006052437 A1 5/2008
DE 102007058872 A1 4/2009

(Continued)

*Primary Examiner* — Jermele M Hollington
*Assistant Examiner* — Taqi R Nasir
(74) *Attorney, Agent, or Firm* — Harness, Dickey & Pierce, P.L.C.

(57) ABSTRACT

An MR system including a control computer and a digital control device is described. The control computer includes an external digital image data port for transmitting control data, including sequence data and encoded as image data, from the control computer to a digital control device; and the digital control device includes a port, compatible with the external digital image data port of the control computer, for receiving the control data, received from the external digital image data port and designed to extract the sequence data from the received control data, encoded as image data. A method for activating a digital control device via a control computer is also described.

18 Claims, 3 Drawing Sheets

(51) Int. Cl.
*G05B 19/042* (2006.01)
*G01R 33/561* (2006.01)
*G06T 1/20* (2006.01)
*G06T 1/60* (2006.01)

(52) U.S. Cl.
CPC ......... *G01R 33/561* (2013.01); *G05B 19/042* (2013.01); *G06T 1/20* (2013.01); *G06T 1/60* (2013.01)

(58) Field of Classification Search
CPC . G06T 1/60; A61B 5/055; E21B 49/08; E21B 2049/085; G01N 24/10
USPC ......................... 324/307, 309, 318, 322, 314
See application file for complete search history.

(56) References Cited

U.S. PATENT DOCUMENTS 6,068,595 A * 5/2000 Miyazaki ........... G01R 33/5635 324/309
6,801,037 B1 * 10/2004 Zhang .................... G01R 33/54 324/309
2008/0136417 A1 6/2008 Baumgartl et al.
2008/0231269 A1 * 9/2008 Ookawa ............ G01R 33/3415 324/307
2009/0096546 A1 4/2009 Demharter et al.
2009/0137898 A1 5/2009 Demharter et al.
2009/0251141 A1 10/2009 Baumgartl et al.
2012/0249140 A1 * 10/2012 Albsmeier ......... G01R 33/3692 324/309
2013/0050582 A1 * 2/2013 Tran ................. H04N 21/43635 348/724
2015/0061673 A1 * 3/2015 Li ...................... G01R 33/4818 324/309
2015/0369891 A1 * 12/2015 Miyazaki ........... G01R 33/5617 324/309
2016/0174928 A1 6/2016 Demharter

FOREIGN PATENT DOCUMENTS

DE 102008017819 B3 12/2009
DE 102013217617 A1 3/2015

* cited by examiner 500
5.I
SD: 12 → 13
5.II
SD → 13a
5.III
SD → SQD

MR SYSTEM AND METHOD FOR TRANSMITTING CONTROL DATA TO A DIGITAL CONTROL DEVICE IN AN MR SYSTEM

PRIORITY STATEMENT

The present application hereby claims priority under 35 U.S.C. § 119 to European patent application number EP17200151.3 filed Nov. 6, 2017, the entire contents of which are hereby incorporated herein by reference.

FIELD

Embodiments of the invention generally relate to an MR system with a control computer and a digital control device and to a method for activating a digital control device by way of a control computer in an MR system.

BACKGROUND

In a magnetic resonance system, also known as magnetic resonance tomography system or magnetic resonance installation, in order to produce magnetic resonance recordings the body to be examined is typically exposed to a relatively high basic magnetic field, for example of 1.5, 3 or 7 tesla, with the aid of a basic field magnet system. In addition, a magnetic field gradient is applied with the aid of a gradient system. Using a high-frequency transmit system, high-frequency excitation signals (HF signals) are then emitted via suitable antenna devices, which should result in the nuclear spin of particular atoms resonantly excited by this high-frequency field being tilted by a defined flip angle compared to the magnetic field lines of the basic magnetic field.

When the nuclear spins are relaxed, high-frequency signals known as magnetic resonance signals are emitted and are received by a high-frequency receive system via suitable receiving antennas and then further processed. From the raw data thereby acquired, the desired image data can finally be reconstructed.

For a particular measurement, a particular pulse sequence then has to be emitted, which consists of a series of high-frequency pulses, in particular excitation pulses and refocusing pulses, as well as gradient pulses to be emitted suitably coordinated therewith in various spatial directions. Temporally adapted thereto, readout windows for the high-frequency receive system must be set, during which the induced magnetic resonance signals are acquired. Of particular importance here for the imaging is in particular the timing within the sequence, that is, the temporal intervals at which pulses follow one another. FIG. 1 shows an example of such a pulse sequence.

An MR system has at least one control computer, on which the cited sequence is executed. Furthermore, an MR system comprises a digital control device, which receives control data from the control computer comprising the pulse sequence and accordingly applies pulses, such as, for instance, gradient pulses, HF pulses etc., with which the imaging process is carried out.

FIG. 2 shows a conventional arrangement of an MR system with a control computer and a digital control device activated by the control computer.

A standard computer is readily used as a control computer and image reconstruction computer. It is particularly advantageous here, for cost reasons, to take an "off-the-shelf" computer that is unmodified as far as possible, and to allow the MR-specific software to run on it (in particular the software for controlling the measurement, in other words the "sequence"). Both this and also the receipt of the MR raw data requires a real-time operating system, since, in each case, it is necessary to communicate with hardware specific to the MR system and the data buffers realized there have a restricted size and in particular the data for activating the MR system-specific hardware is to be transmitted over a very short period of time.

The digital control device specific to the MR system realizes the execution of these instructions for the sequence. Since in this regard an extremely time-critical and jitter-free synchronization of the various subsystems or their activities (gradient, TY, RX, periphery) is important, this process cannot be realized solely with software, but instead requires a cycle-precise implementation with the aid of FPGAs, for instance.

Part of the hardware specific to the MR system is typically accommodated at least in parts in the control computer, in order to be able to supply the digital control device with very short communication times with the instructions generated from the sequence. It would be simpler and more cost-effective to use external communication interfaces, which involve a home computer, for instance USB interfaces or Ethernet interfaces.

Unfortunately these external OTS interfaces (OTS=off the shelf=designed as a standard product) cannot be used or only very ineffectively, since the data generally has to be passed through comprehensive software layers of the operating system and/or non-influenceable hardware protocols and a time-critical application of control commands is therefore not possible precisely. In such a case, the connection via the computer-internal buses, for instance PCIe bus systems, is therefore used, for which separate drivers can be written and the timing is therefore kept sufficiently under control. The major disadvantage here is that in this way computer interfaces are used, which are only accessible internally, i.e. for an installation of such an interface the computer has to be opened and additional hardware fitted. A simple connection of the MR-specific hardware using cables or plugs to an existing standard-external interface would be ideal, like for instance USB or Ethernet, without needing to open and therefore modify the computer.

The synchronization of the afore-cited system components or subsystems and the associated device types within the required accuracy range places high demands on the controller and thus also on the temporally correct application and transmission of the pulse sequence by the control computer of the MR system to the control device.

DE 102006052437 A1 and DE 102008017819 B3 each show a design of an MR control system; DE 102007058872 A1, US 20090137898 A1, US 20160174928 A1 each show devices for transmitting data in an MR system.

SUMMARY

At least one embodiment of the present invention creates a simpler and at the same time sufficiently reliable and precise type of sequence data transmission between the control computer and a digital control device of an MR system.

At least one embodiment is directed to an MR system and to a method for activating a digital control device via a control computer of an MR system.

At least one embodiment includes An MR system, comprising:

a control computer including an external digital image data port for transmitting control data, including sequence data and encoded as image data, from the control computer to a control device; and the digital control device including a port, compatible with the external digital image data port of the control computer, for receiving the control data, received from the external digital image data port and designed to extract the sequence data from the received control data, encoded as image data.

At least one embodiment is directed to an inventive method for activating a digital control device of an MR system via a control computer, the method comprising:

receiving control data, including sequence data and encoded as image data, from an external digital image data port of the control computer, the control data, encoded as image data, being received by a port of the digital control device, compatible with the external digital image data port of the control computer; and extracting the sequence data from the control data received to activate the digital control device via the control computer of the MR system.

At least one embodiment is directed to an inventive method for activating a digital control device of an MR system via a control computer of the MR system, comprising:

transmitting, from an external digital image data port of the control computer, control data including sequence data and encoded as image data, to the digital control device, the digital control device including a port, compatible with the external digital image data port of the control computer, for receiving the control data from the external digital image data port and designed to extract the sequence data from the received control data, encoded as image data, to activate the digital control device.

At least one embodiment is directed to an inventive non-transitory computer-readable medium, storing program sections readable in and executable by at least one of the digital control device and the control computer, to carry out at least one embodiment of the method when the program sections are executed by the at least one of the digital control device and the control computer.

BRIEF DESCRIPTION OF THE DRAWINGS

The invention will be described again in greater detail below using example embodiments by reference to the accompanying drawings. In the drawings.

DETAILED DESCRIPTION OF THE EXAMPLE EMBODIMENTS

Figure 1:
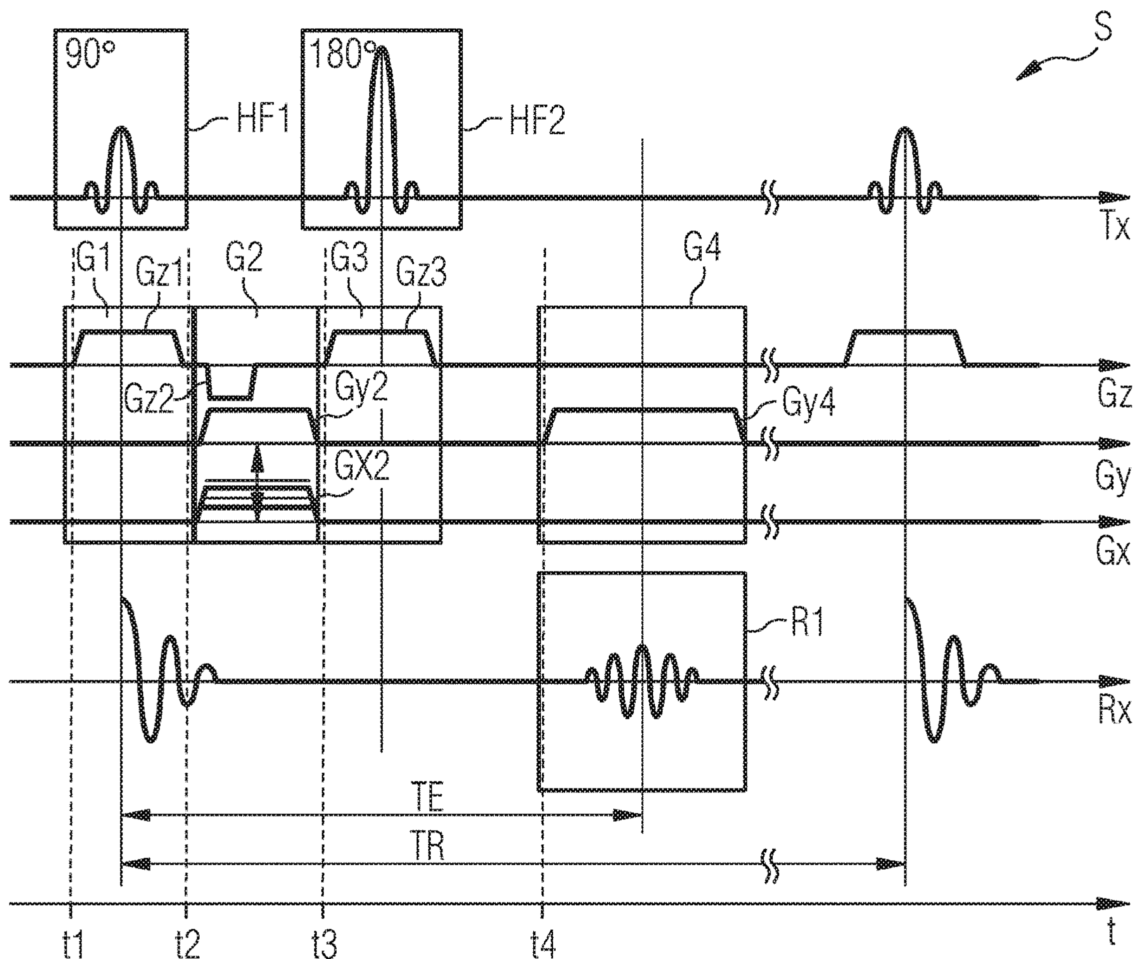
FIG. 1 shows an example pulse sequence, which can be applied correctly, in terms of its timing, with the inventive MR system, divided into event blocks.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated. The present invention, however, may be embodied in many alternate forms and should not be construed as limited to only the example embodiments set forth herein.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "exemplary" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Before discussing example embodiments in more detail, it is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments of the present invention. This invention may, however, be embodied in many alternate forms and should not be construed as limited to only the embodiments set forth herein.

Units and/or devices according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner. Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

Even further, any of the disclosed methods may be embodied in the form of a program or software. The program or software may be stored on a non-transitory computer readable medium and is adapted to perform any one of the aforementioned methods when run on a computer device (a device including a processor). Thus, the non-transitory, tangible computer readable medium, is adapted to store information and is adapted to interact with a data processing facility or computer device to execute the program of any of the above mentioned embodiments and/or to perform the method of any of the above mentioned embodiments.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as a computer processing device or processor;

however, one skilled in the art will appreciate that a hardware device may include multiple processing elements or processors and multiple types of processing elements or processors. For example, a hardware device may include multiple processors or a processor and a controller. In addition, other processing configurations are possible, such as parallel processors.

The computer programs include processor-executable instructions that are stored on at least one non-transitory computer-readable medium (memory). The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc. As such, the one or more processors may be configured to execute the processor executable instructions.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

Further, at least one embodiment of the invention relates to the non-transitory computer-readable storage medium including electronically readable control information (processor executable instructions) stored thereon, configured in such that when the storage medium is used in a controller of a device, at least one embodiment of the method may be carried out.

The computer readable medium or storage medium may be a built-in medium installed inside a computer device main body or a removable medium arranged so that it can be separated from the computer device main body. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

Most of the aforementioned components, in particular the identification unit, can be implemented in full or in part in the form of software modules in a processor of a suitable control device or of a processing system. An implementation largely in software has the advantage that even control devices and/or processing systems already in use can be easily upgraded by a software update in order to work in the manner according to at least one embodiment of the invention.

At least one embodiment of the inventive MR system includes a control computer and a digital control device, the control computer having an external digital image data port for transmitting control data encoded as image data and comprising sequence data from the control computer to the digital control device. An external interface for transmitting image data to an image display device or an image-processing device is to be understood in this context as an external digital image data port.

The digital control device comprises, in accordance with at least one embodiment of the invention, a port which is compatible with the external digital image data port of the control computer for receiving the control data transferred from the external digital image data port and encoded as image data and is configured to extract the sequence data from the received control data encoded as image data. To this end, software adjusted to a protocol used for the transmission of control data encoded as image data, for instance a computer program, can be used in the digital control device. The extraction process can also be carried out with the aid of a modified hardware component, for instance a correspondingly adjusted FPGA module.

An interface architecture present in the control computer can advantageously be used unchanged for a real-time-critical data transmission to the digital control device. No modifications have to be performed here internally to the hardware of the control computer. Instead, with the aid of a suitably modified program running in the control computer, in other words software, the data flow of the control data is diverted to the digital image data port which is available as standard. In other words, the control data which is to be transmitted externally to the digital control device is only to be "wrapped" accordingly. I.e. it is converted in accordance with the protocol of the digital image data port and written directly into the frame buffer.

In such cases a direct writing of the sequence framework, in other words the software used for the sequence data generation, into the RAM can take place in the case of a graphic card integrated into the motherboard. With this preferred embodiment, the RAM memory of the CPU is simultaneously the buffer memory of the digital image data port. I.e. no driver or other operating system mechanism is required at the point in time of applying the sequence (at runtime) (or only initially at setup), which enables and simplifies a time-critical transmission and application of pulse sequences.

Contrary to conventional arrangements, the interface used for the transmission of control data need not in addition be installed internally, thereby reducing the effort involved in connecting a new control computer in an MR system.

With the inventive method of at least one embodiment, for activating a digital control device of an MR system via a control computer, control data including sequence data and encoded as image data is transferred to the digital control device by way of an external digital image data port of the control computer, for instance with a specific data protocol. Advantageously this is done using suitably modified software, with which the sequence data is written into an image memory, preferably the RAM memory mentioned, in the image data port. Here the temporal sequence of the transmission of the control data may be adjusted to the temporal sequence of the image data transmission of the image data port. The control data encoded as image data is received by a port of the digital control device which is compatible with the external digital image data port of the control computer. For this purpose the data protocol of the external digital image data port is implemented in the digital control device. Finally the sequence data is extracted from the received control data. At least one embodiment of the inventive method shares the advantages of the at least one embodiment of the inventive MR system.

The claims and the description which follows contain particularly advantageous developments and embodiments of the invention, wherein in particular the claims of one category can also be developed similarly to the claims of another claims category and their parts of the description and features of various example embodiments can be combined to form new example embodiments.

In one embodiment of the inventive MR system, the digital control device is designed to implement the data protocol of the external digital image data port. Advantageously the read-out process in the digital control device is adjusted to the modified data protocol of the graphical interface used, so that the control data can be received correctly.

In a particularly preferred embodiment of the inventive MR system, the control computer comprises a computer with a real-time operating system. A real-time operating system allows for a guaranteed responsiveness of the control computer during the control data transmission process. With the use of hardware buffers, such as the cited frame buffer, guaranteed responsiveness of this type is required except in the case of very pronounced time latencies.

In one embodiment of the inventive MR system, what is known as double buffering is applied. What this means is that while an image is output (corresponding to a storage area in the image memory (frame buffer), for instance the RAM memory of the control computer), the software can calculate a new image in a further separate storage area. If the first image was output completely, then in order to output the next image, a switch is made to the second storage area, and the first storage area can be rewritten again "unhindered" by the software. In this way a certain amount of time is gained when the frame buffer is filled. This procedure can now be applied to the writing of the frame buffer with the control data. In this case time is also gained in order to determine the sequence data and write it into the frame buffer.

FIG. 1 shows a conventional pulse diagram using the example of a spin echo sequence S. In this pulse diagram, the various pulses having to be carried out by different system components of a magnetic resonance imaging system are shown one on top of the other on various time axes. To apply the pulses, corresponding command sequences are firstly generated by a control computer and transferred to a digital control device. The digital control device generates various types of control signals for emitting and receiving various types of pulses, which are shown in FIG. 1.

The high-frequency signal to be emitted is shown on the topmost axis (transmit axis Tx). With this spin echo sequence S, two high-frequency pulses HF1, HF2 have to be emitted consecutively, firstly a 90° excitation pulse HF1 and then a 180° refocusing pulse HF2 after a specific interval. Since both high-frequency pulses HF1, HF2 are to act spatially selectively, a slice selection gradient pulse Gz1, Gz3 is in each case to be switched at the same time; this is shown on the second axis from the top, the slice selection axis Gz. A further slice selection gradient pulse Gz2 in the negative direction and a frequency encoding gradient pulse Gy2 on the frequency encoding axis Gy (third axis from above) and a phase encoding pulse Gx2 in the phase encoding direction, i.e. on the phase encoding axis Gx, are emitted between these two slice selection gradient pulses Gz1, Gz3. The individual gradient pulses Gz1, Gz2, Gz3, Gy2, Gx2 for the various spatial directions are combined here as gradient events G1, G2, G3 in each case.

After a specific echo time TE after the maximum of the first high-frequency pulse HF1, an echo signal then takes place, which has to be detected in order to detect the raw data for the image reconstruction. To this end, a read-out window R1 is simultaneously connected as an event on the ADC of the receive device (see read-out axis Rx). A read-out gradient pulse Gy4 is applied at the same time, and is shown as a gradient event G4. After a repetition time TR, the sequence S is then repeated, wherein in each case the phase encoding gradient pulse Gx2 is then set with another amplitude until a desired slice is read out.

As shown here, the individual events begin, which are initiated by the control commands and in this respect represent the control commands, i.e. the application of the high-frequency pulses HF1, HF2 and the gradient events G1, G2, G3, G4 and the setting of the read-out window R1, at entirely accurately defined times or time instants t1, t2, t3, t4 (see lowermost axis of the sequence diagram in FIG. 1). In order to be able to execute the cited time-critical operations in a synchronized manner, the command sequences required to generate the pulses described have to be output in a temporally precise manner by the control computer and transmitted to the digital control device of the magnetic resonance image system within a defined time.

Figure 2:
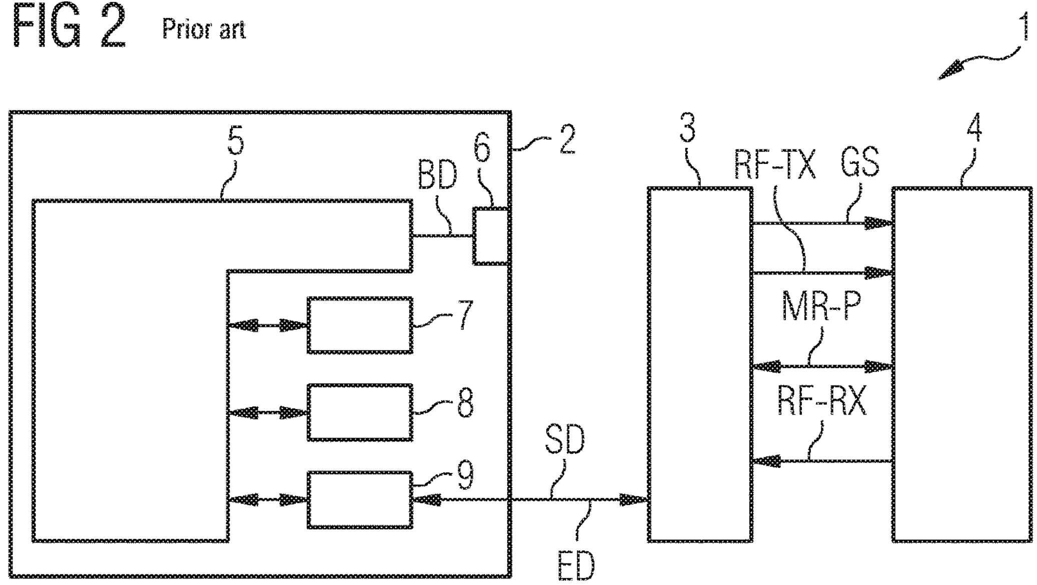
FIG. 2 shows a block diagram of a magnetic resonance system according to the prior art.

A simplified block diagram of a conventional magnetic resonance system 1 is shown in FIG. 2. Such a conventional magnetic resonance system 1 comprises a control computer 2, a digital control device 3 and the actual magnetic resonance scanning unit 4.

As already mentioned, the command sequences required to generate the pulses described are firstly output in a temporally precise manner by the control computer 2 and transmitted to the digital control device 3 of the magnetic resonance image system within a defined time. Individual components of the scan unit 4 of the magnetic resonance system are then activated by the digital control device 3. To this end, the requisite control commands GS, RF-TX are generated by the digital control device 3 and at the right time are conveyed to the individual system components of the scan unit 4, so that these execute the commands at the right time instant with respect to one another and the desired physical events therefore occur.

The control computer 2 comprises a central processing unit 5, which is used for pulse sequence generation and reconstruction of image data on the basis of raw data. The central processing unit 5 is connected via an integrated graphics chip with a digital video interface 6 for activating a graphics screen in order to display image data BD. Furthermore, the central processing unit 5 works together with a RAM memory 7 and is connected with a plurality of interfaces 8 to peripheral systems. Real-time-critical control data SD for generating pulse sequences is transmitted by the central processing unit 5 via a PCIe plug-in card 9 to the digital control device 3. Results data ED, for instance raw data, is transmitted by the digital control device 3 via the PCIe card 9 to the central processing unit 5.

The digital control device 3 can moreover have another plurality of further components, for instance components for further processing the signals RF-RX or raw data received by the high-frequency receive system of the scan unit 4 and possibly reconstruction units, in order to reconstruct the image data from the raw data etc.

The scan unit 4 comprises for instance a gradient system with three magnetic field gradient coils for generating magnetic field gradients Gx, Gy, Gz in the x-, y- and z-direction. These magnetic field gradient coils for the various spatial directions can be activated independently of one another so that, by way of a predetermined combination, gradients can be applied in any logical spatial directions, for instance in the slice selection direction, in the phase encoding direction or in the read-out direction. In such cases these directions are generally dependent on the selected slice orientation. Similarly, the logical spatial directions can however also match the x-, y- and z-directions, for instance slice selection direction in the z-direction, phase encoding direction in the y-direction and read-out direction in the x-direction.

Furthermore, a high-frequency transmit system and a high-frequency receive system form part of these system components of the scan unit 4 which are to be activated in a time-critical manner or coordinated with corresponding pulse sequences. The high-frequency transmit system generally comprises in turn a number of subsystems or subcomponents, for instance a number of transmit coils (or transmit antennas), with associated transmit amplifiers etc. Accordingly the high-frequency receive system can also have almost any number of receive subsystems with in each case individual receive coils (or receive antennas), preamplifiers, analog-digital converters etc. A number of receive coils are shown here as subsystems or subcomponents.

In the case of the transmit coils, in order to emit the high-frequency signals, this may be a conventional whole-body coil or possibly additional local coils, for instance. These transmit coils can likewise be used as receive coils, provided they can be switched between receive and transmit mode. It is however in principle also possible to use separate receive coils.

Aside from the cited system components, such a scan unit 4 naturally still has a plurality of further system components or subsystems, in particular a basic field magnet system, in order to apply the examination object or the patient (not shown) initially with a basic magnetic field.

A patient tunnel (bore) is arranged centrally in the scan unit 4, in which the examination object can be moved in and out on a mobile couch or can be positioned at any point in the bore. The basic magnetic field system is designed such that as homogeneous a basic magnetic field as possible is applied in a defined central region within this bore. The gradient coils are wound accordingly such that as previously described in the various directions a magnetic field gradient can be superimposed onto the basic magnetic field and the transmit and receive coils are arranged accordingly such that within this bore they emit the high-frequency signals into specific areas or receive them therefrom. All these system components are however known to the person skilled in the art and therefore do not need to be explained further here in detail. It should also be noted at this point that it is not only a previously cited magnetic resonance system with a bore that can be activated in accordance with the invention, but instead also laterally open, U-shaped magnetic resonance systems, or magnetic resonance systems of a smaller type for individual appendages etc. As shown here, the individual components of the scan unit are activated by way of control commands GS, RF-TX, MR-P for gradients, for HF excitation signals and for non-time-critical processes by the digital control device 3.

Figure 3:
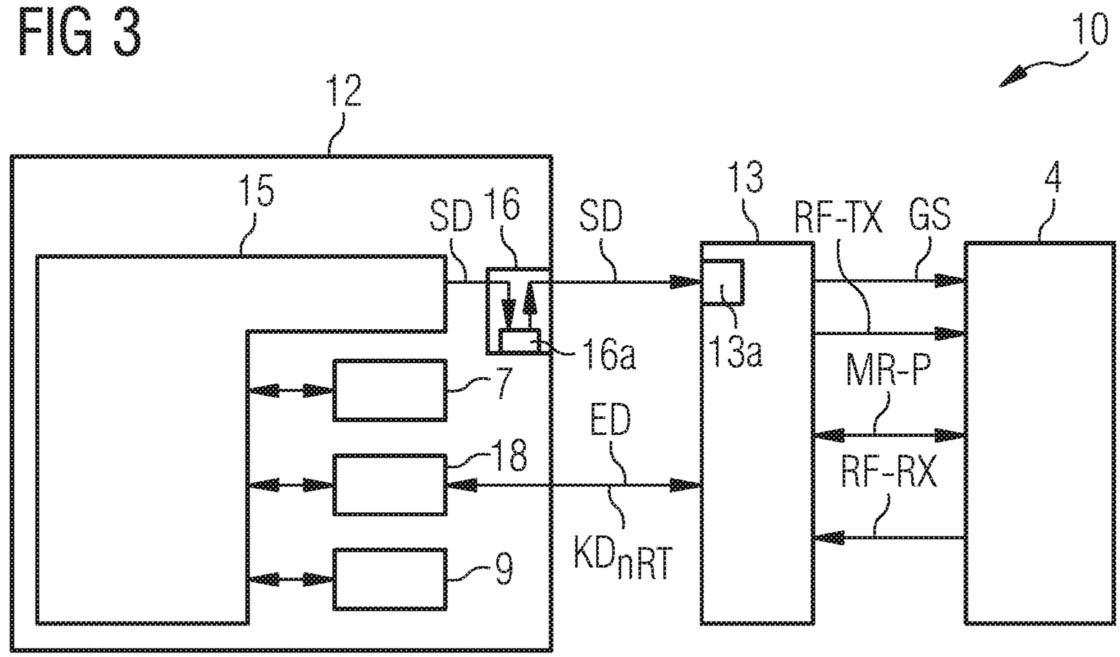
FIG. 3 shows a block diagram of an example embodiment of an inventive magnetic resonance system.

FIG. 3 shows a simplified block diagram of a magnetic resonance system 10 according to one example embodiment of the invention. Compared with the conventional magnetic resonance system 1 shown in FIG. 2, the control computer 12 and the digital control device 13 in FIG. 3 are designed differently or activated differently. The control computer 12 likewise comprises a central processing unit 15 with a separate graphic card. The central processing unit 15 is now additionally used to write control data SD encoded as graphic data or image data into a frame buffer memory 16*a*, also called frame buffer, of a graphical interface 16, i.e. an interface 16 for a graphical display, and to transfer this control data SD via the interface 16, also referred to as the external digital image data port, to a digital control device 13. For this purpose suitable software for generating and outputting pulse sequences or control commands can be modified such that the control data SD is forwarded to the graphical interface 16. The digital control device 13 has a digital port 13*a* which is compatible with the external digital image data port 16 for receiving this control data SD. This additional digital port 13*a* is designed to extract the sequence data from the received control data SD. To this end, the additional port is physically adjusted to the graphical interface 16 of the control computer 12 and the protocol used by the graphical interface 16 of the control computer 12. Moreover, the software of the digital control device 13 should also be adjusted to the temporal cycle of the image output.

I.e. the software of the digital control device 13 has to be adjusted in order to read the control data SD encoded as image data from the external digital image data port 16 or from the frame buffer memory 16*a* assigned hereto. In this way, the software specific to the digital control device 13, i.e. the software used for pulse sequence generation in the control computer 12, can communicate directly with the digital control device 13 by using the graphical interface 16.

In the case shown in FIG. 3, the graphic card 16 is embodied separately from the CPU with a separate frame buffer memory 16*a*.

As already mentioned, the transport of sequence data or control data SD comprising the same from the control computer 12 to the digital control device 13 is particularly time-critical. By contrast, more easily accessible external interfaces, such as for instance Ethernet interfaces or USB interfaces, can be used for the data transport of receive data ED or non-time-critical communication data KDnRT in the control computer 12, so that a non-time-critical bidirectional communication of the control computer 12 with the digital control device 13 is possible via standard, pre-existing external computer interfaces.

Figure 4:
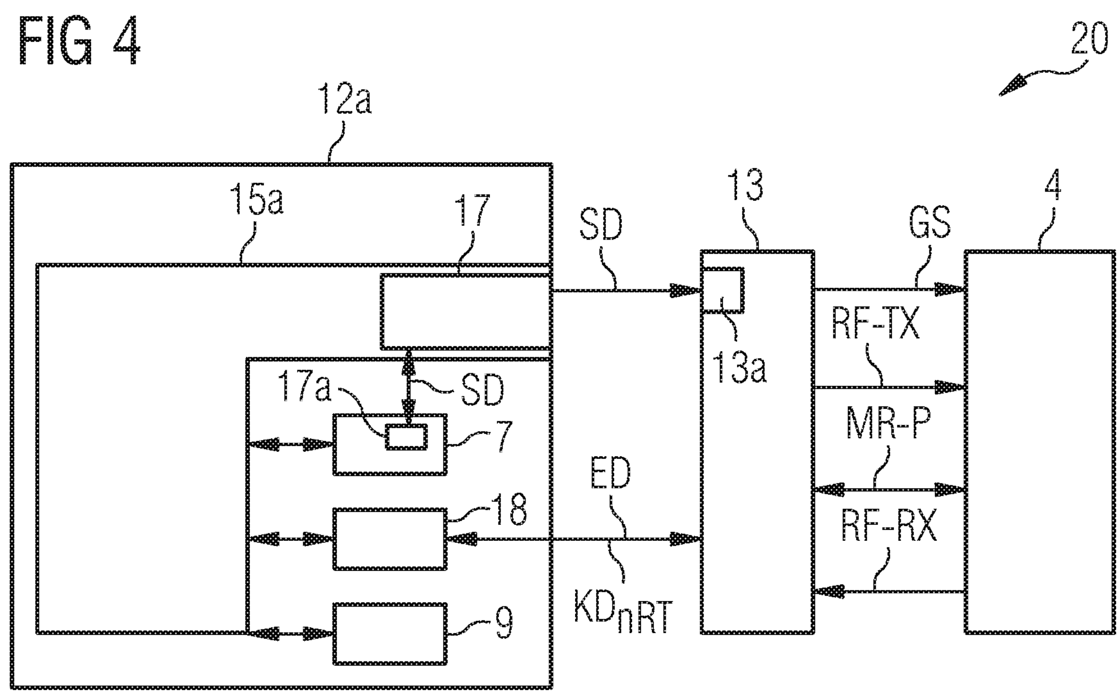
FIG. 4 shows a block diagram of an alternative example embodiment of an inventive magnetic resonance system.

FIG. 4 shows a simplified block diagram of a magnetic resonance system 20 according to an alternative example embodiment of the invention. The MR system 20 shown in FIG. 4 differs from the example embodiment shown in FIG. 3 only in that a slightly differently designed control computer 12*a* is used, which uses a CPU 15*a*, in which a graphical unit 17 is integrated directly (onboard graphic). The graphical interface 17 can therefore be supplied with data, which is available directly in the main memory 7 of the central processing unit 15*a*, for instance a RAM memory, so that here a temporally precisely-clocked reading-out of control data SD can be realized particularly easily. I.e. in this variant the frame buffer memory 17*a* is realized as a section of the RAM memory or main memory 7.

Figure 5:
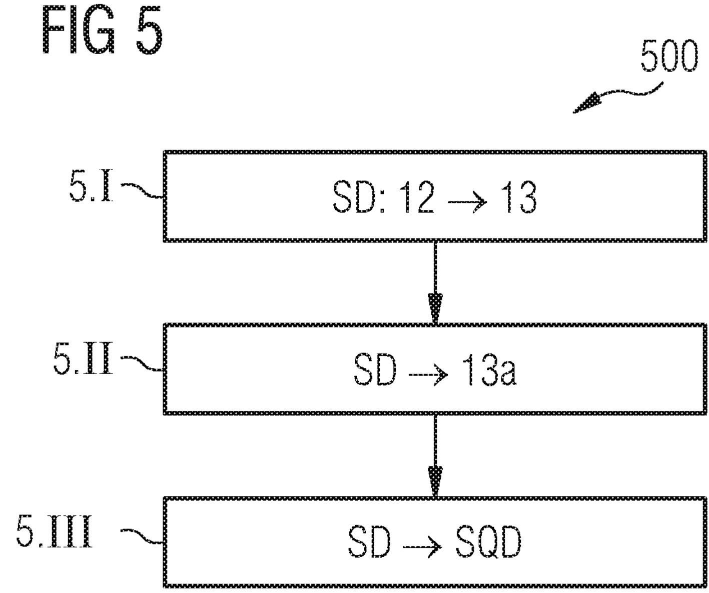
FIG. 5 shows a flow chart, which illustrates a method for activating a digital control device via a control computer of an MR system according to one example embodiment of the invention.

FIG. 5 shows a flow chart 500, which illustrates a method for activating a digital control device via a control computer of an MR system according to one example embodiment of the invention. In step 5.I, control data SD comprising sequence data SQD is firstly transmitted via an external digital image data port 16 of the control computer 12 to the control device 13.

The control data SD is received in step 5.II by a port 13*a* of the digital control device 13 which is compatible with the external digital image data port 16 of the control computer 12. Finally, in step 5.III, the sequence data SQD is extracted from the received control data SD in the digital control device 13.

Finally, it should again be noted that the detailed methods and setups described above are example embodiments and that the basic principle can also be varied over a wide range of areas by a person skilled in the art without departing from the field of the invention as defined by the claims. For the sake of completeness, it should also be noted that the use of the indefinite article "a" or "an" does not preclude the relevant features also being present plurally. Similarly, the expression "unit" does not preclude this consisting of a plurality of components which may also be spatially distributed.

The patent claims of the application are formulation proposals without prejudice for obtaining more extensive patent protection. The applicant reserves the right to claim even further combinations of features previously disclosed only in the description and/or drawings.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A magnetic resonance (MR) system, comprising:

a control computer including an external digital image data port configured to send real-time control data from the control computer to a digital control device, the real-time control data including pulse sequence data and the real-time control data being encoded as image data; and the digital control device including a digital control device port, the digital control device port being compatible with the external digital image data port of the control computer, the digital control device port configured to receive the real-time control data from the external digital image data port, and configured to extract the pulse sequence data from the received real-time control data, the received real-time control data being encoded as image data.

2. The MR system of claim 1, wherein the control computer includes a motherboard including an integrated graphic processor, the motherboard configured to send the control data to the digital control device in a temporally clocked manner.

3. The MR system of claim 1, wherein the control computer includes a separate graphic processor.

4. The MR system of claim 3, wherein the separate graphic processor is configured to execute machine-readable instructions that, when executed by the separate graphic processor, cause the MR system to, write the real-time control data into an image memory of the external digital image data port, and adjust a temporal sequence of transmission of the real-time control data to a temporal sequence of an image data transmission of the external digital image data port.

5. The MR system of claim 1, wherein the control computer includes an MR control device, and the MR system is configured to implement a data protocol of the external digital image data port.

6. The MR system of claim 1, wherein the control computer includes a computer with a real-time operating system.

7. The MR system of claim 2, wherein the integrated graphic processor is configured to execute machine-readable instructions that, when executed by the integrated graphic processor, cause the MR system to write the real-time control data into an image memory of the external digital image data port, and adjust a temporal sequence of transmission of the real-time control data to a temporal sequence of an image data transmission of the external digital image data port.

8. The MR system of claim 2, wherein the control computer includes an MR control device and is configured to implement a data protocol of the external digital image data port.

9. The MR system of claim 3, wherein the control computer includes an MR control device and is configured to implement a data protocol of the external digital image data port.

10. The MR system of claim 4, wherein the control computer includes an MR control device and is configured to implement a data protocol of the external digital image data port.

11. The MR system of claim 1, wherein the control computer further includes at least one interface, separate from the external digital image data port, the at least one interface configured to receive results data from the digital control device.

12. The MR system of claim 1, further comprising:

a magnetic resonance imager, wherein the digital control device is configured to control the magnetic resonance imager based on the pulse sequence data in the real-time control data.

13. The MR system of claim 4, wherein the machine-readable instructions include instructions to directly write the real-time control data into the image memory of the external digital image data port.

14. The MR system of claim 7, wherein the machine-readable instructions include instructions to directly write the real-time control data into the image memory of the external digital image data port.

15. A method for activating a digital control device via a control computer of a magnetic resonance (MR) system, the method comprising:

receiving real-time control data at the digital control device, the real-time control data being sent from an external digital image data port of the control computer, the real-time control data including pulse sequence data and the real-time control data being encoded as image data, the real-time control data being received at a digital control device port of the digital control device, the digital control device being compatible with the external digital image data port of the control computer; and extracting the pulse sequence data from the real-time control data received via the control computer of the MR system to activate the digital control device.

16. A non-transitory computer-readable medium, storing program sections readable in and executable by the digital control device, the control computer, or both the digital control device and the control computer, to carry out the method of claim 15 in response to the program sections being executed by the digital control device, the control computer, or the digital control device and the control computer.

17. A method for activating a digital control device of an MR system via a control computer of the MR system, comprising:

transmitting real-time control data from an external digital image data port of the control computer to the digital control device, the real-time control data including pulse sequence data, the real-time control data encoded as image data, the digital control device including a digital control device port that is compatible with the external digital image data port of the control computer, the digital control device port configured to receive the real-time control data from the external digital image data port and configured to extract the pulse sequence data from the received real-time control data to activate the digital control device.

18. A non-transitory computer-readable medium, storing program sections readable in and executable by the digital control device, the control computer, or the digital control device and the control computer, to carry out the method of claim 17 in response to the program sections being executed by the digital control device, the control computer, or the digital control device and the control computer.

* * * * *